United States Patent
Shiina

(10) Patent No.: US 11,681,186 B2
(45) Date of Patent: *Jun. 20, 2023

(54) DISPLAY DEVICE

(71) Applicant: Japan Display Inc., Tokyo (JP)

(72) Inventor: Hideki Shiina, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/861,255

(22) Filed: Jul. 11, 2022

(65) Prior Publication Data

US 2022/0342253 A1 Oct. 27, 2022

Related U.S. Application Data

(63) Continuation of application No. 17/020,864, filed on Sep. 15, 2020, now Pat. No. 11,415,845, which is a
(Continued)

(30) Foreign Application Priority Data

Mar. 26, 2018 (JP) .............................. JP2018-058620

(51) Int. Cl.
*G02F 1/1345* (2006.01)
*G02F 1/1343* (2006.01)
(Continued)

(52) U.S. Cl.
CPC ........ *G02F 1/13458* (2013.01); *G02F 1/1368* (2013.01); *G02F 1/13439* (2013.01); *G02F 1/133345* (2013.01); *G02F 1/136286* (2013.01); *G06F 3/0412* (2013.01); *H01L 27/124* (2013.01); *G02F 1/13338* (2013.01);
*G02F 2201/123* (2013.01); *G06F 3/044* (2013.01); *G06F 3/04164* (2019.05)

(58) Field of Classification Search
CPC ............... G02F 1/1333; G02F 1/13338; G02F 1/133345; G02F 1/1343; G02F 1/134309; G02F 1/13439; G02F 1/1345; G02F 1/13456; G02F 1/13458; G02F 1/136286; G02F 1/1368; G02F 2201/123; G06F 3/0412; G06F 3/04164; G06F 3/044; G06F 3/04443; G09F 9/00; G09F 9/30; H01L 27/124

See application file for complete search history.

(56) References Cited

U.S. PATENT DOCUMENTS 11,415,845 B2 * 8/2022 Shiina ....................... G09F 9/30
2009/0033857 A1 * 2/2009 Abe .................... G02F 1/13452
349/152

* cited by examiner

*Primary Examiner* — Thoi V Duong
(74) *Attorney, Agent, or Firm* — Xsensus LLP

(57) ABSTRACT

According to one embodiment, a display device includes a first substrate, a second substrate, and a connection member. The first substrate includes a pad portion. The second substrate includes a transparent conductive film located on an outer surface. The connection member electrically connects the pad portion and the transparent conductive film. The pad portion includes a second metal layer, a first organic insulating film having a first through hole penetrating to the second metal layer, a third metal layer being in contact with the second metal layer in the first through hole, and a second organic insulating film covering an end portion of the third metal layer and having a second through hole penetrating to the third metal layer.

19 Claims, 11 Drawing Sheets

Related U.S. Application Data continuation of application No. PCT/JP2019/002355, filed on Jan. 24, 2019.

(51) Int. Cl.
*G02F 1/1333* (2006.01)
*G02F 1/1362* (2006.01)
*G02F 1/1368* (2006.01)
*G06F 3/041* (2006.01)
*H01L 27/12* (2006.01)
*G06F 3/044* (2006.01)

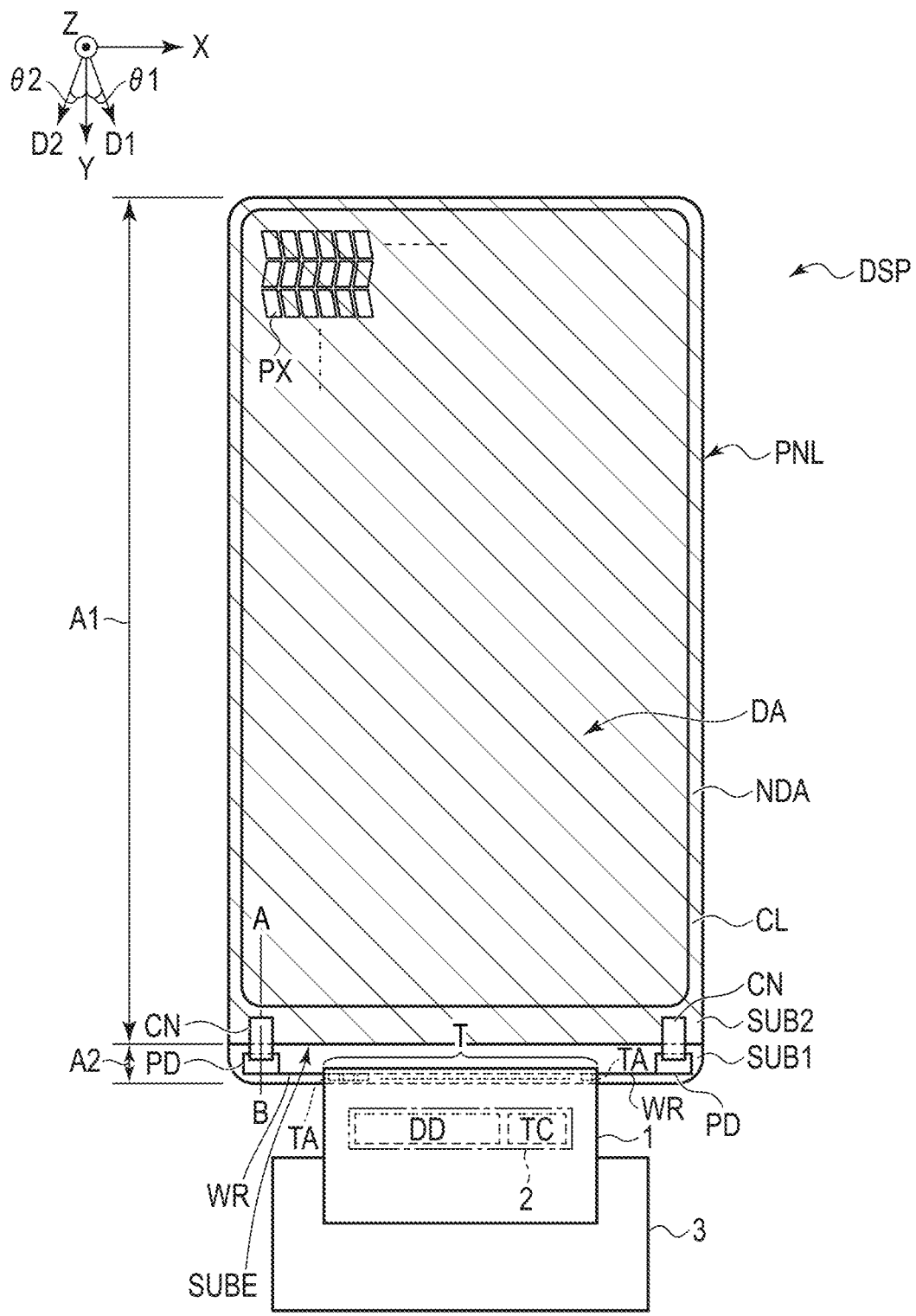
F I G. 1

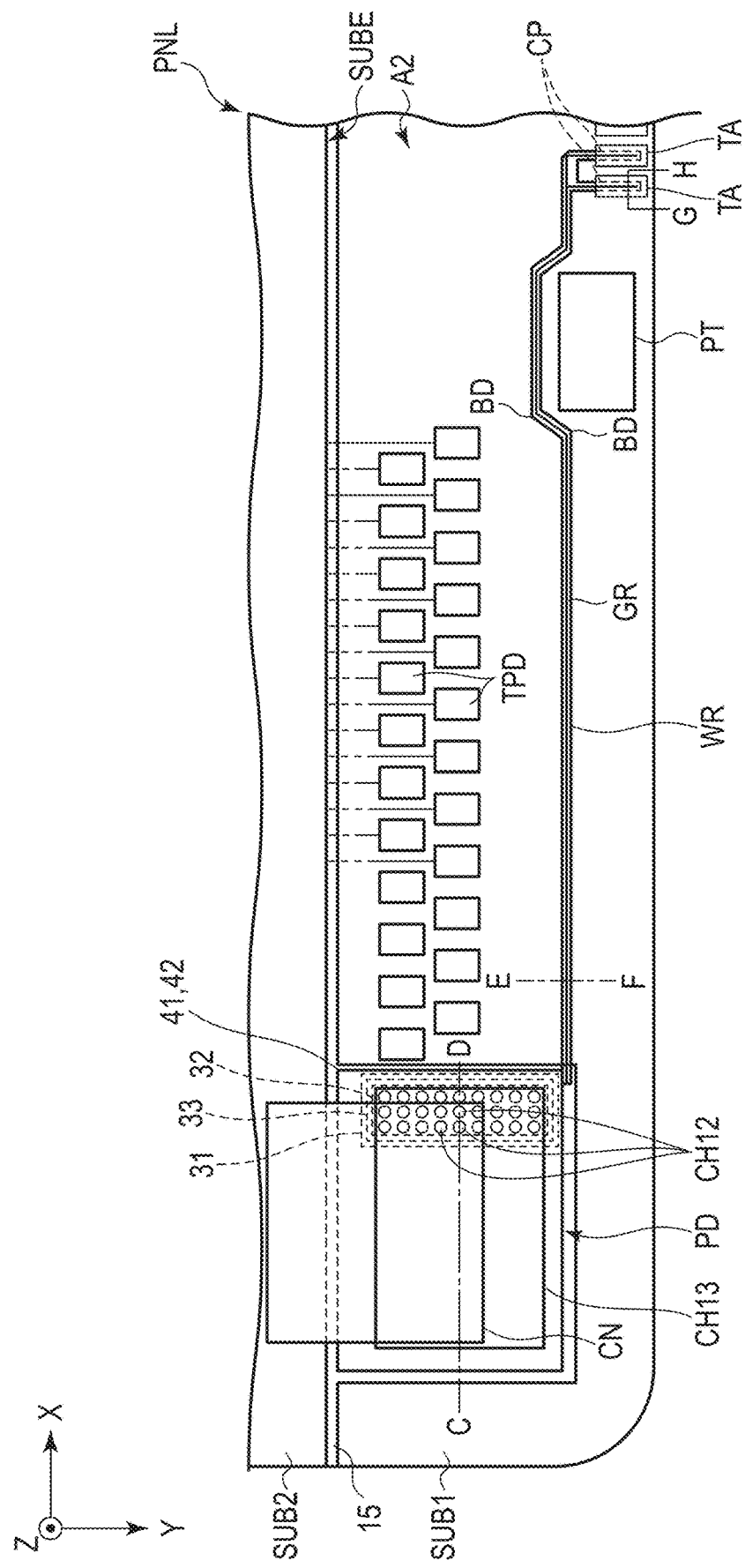
F I G. 3

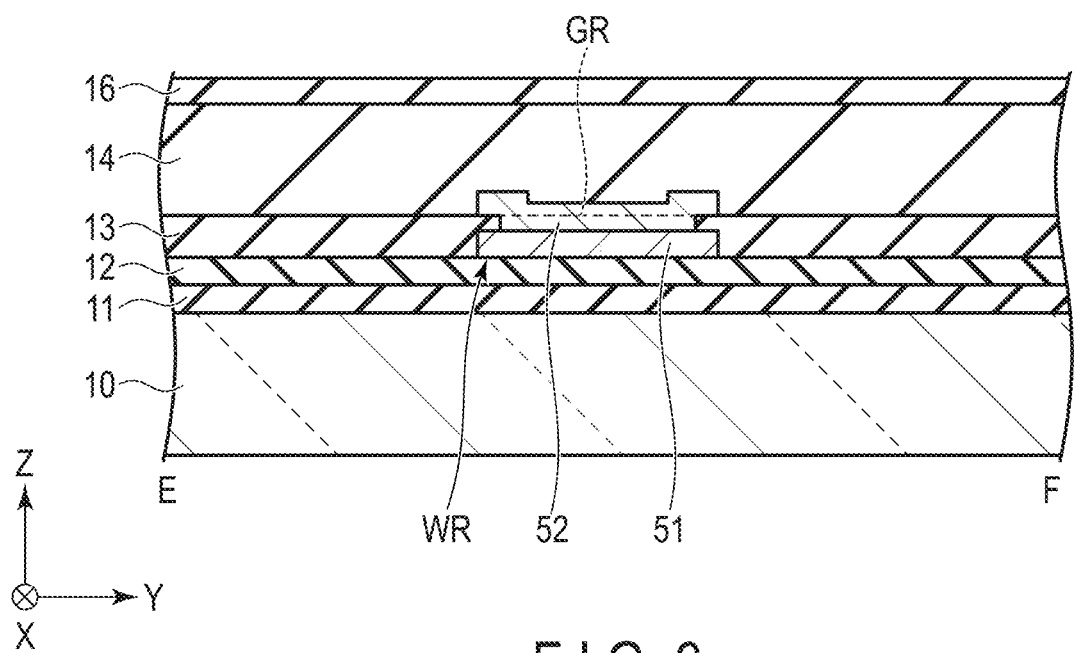
F I G. 6
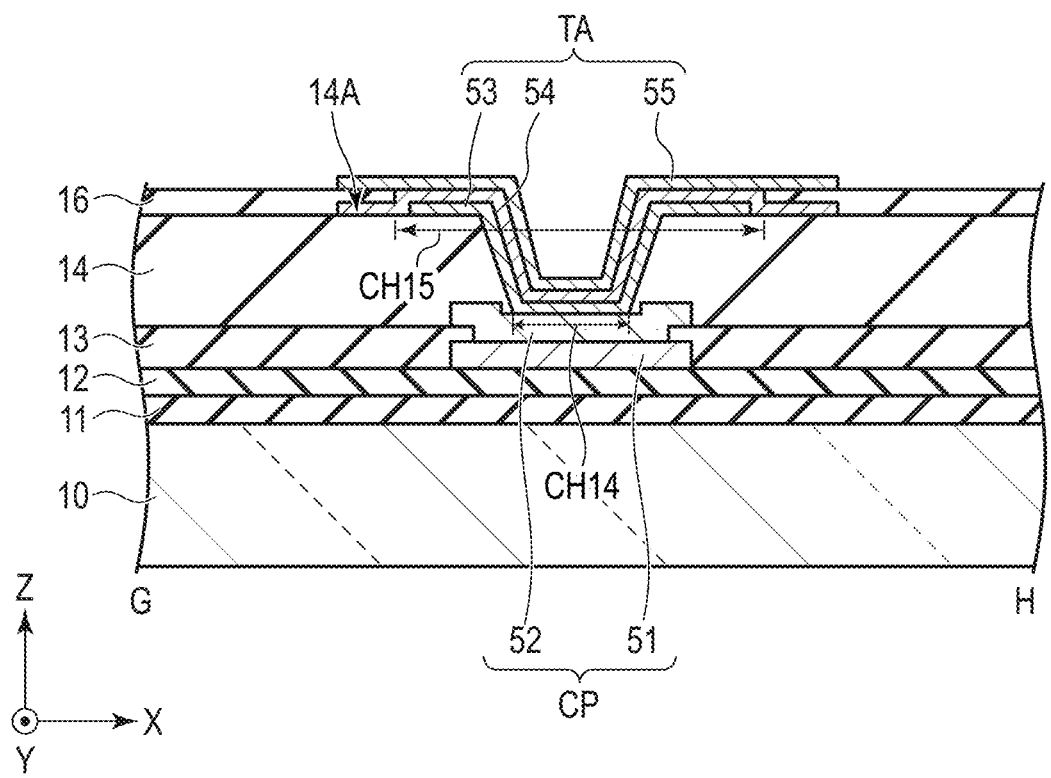
F I G. 7

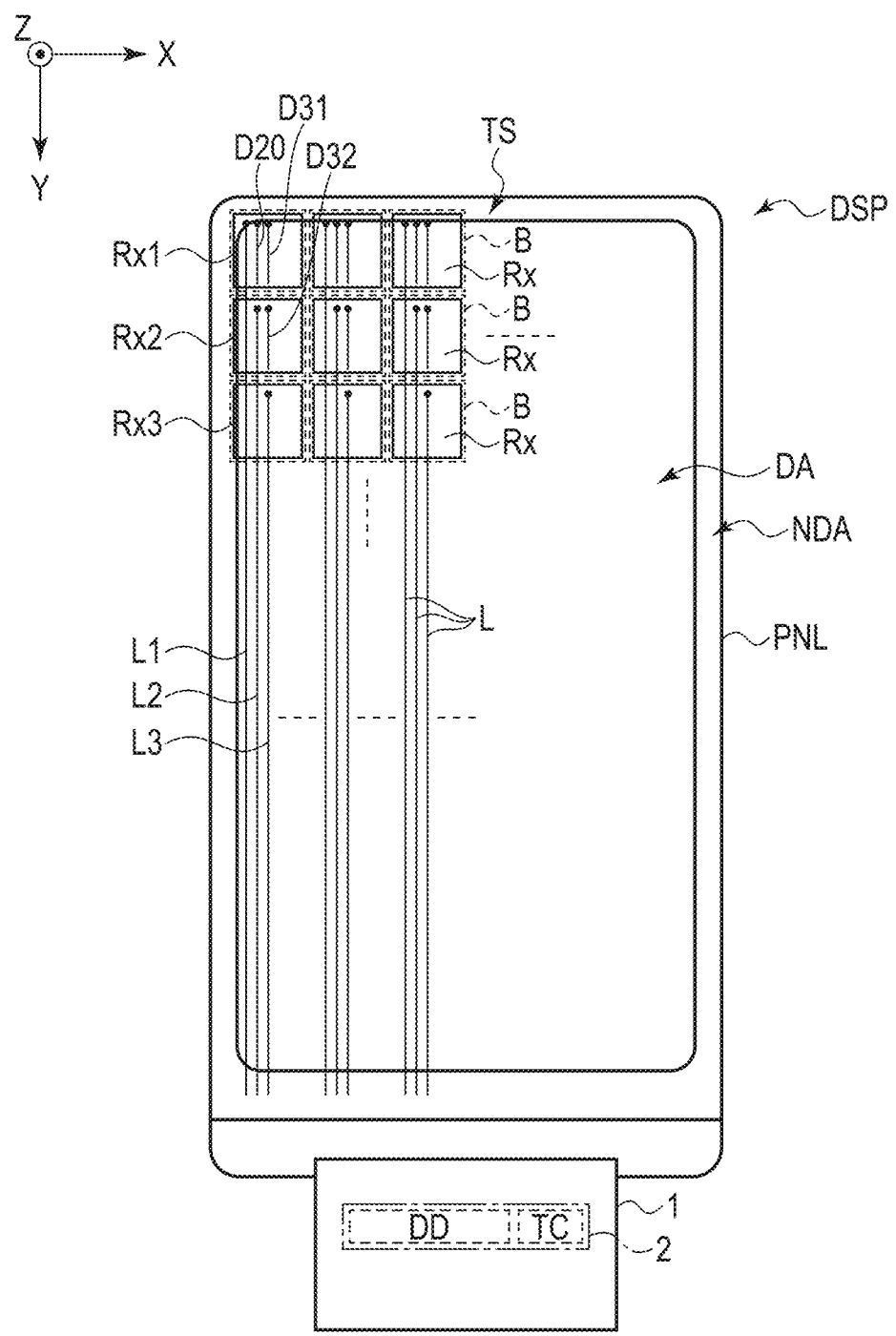
F I G. 8

DISPLAY DEVICE

CROSS-REFERENCE TO RELATED APPLICATIONS

This application is a continuation of U.S. application Ser. No. 17/020,864, filed Sep. 15, 2020, which is a Continuation application of PCT Application No. PCT/JP2019/002355, filed Jan. 24, 2019 and based upon and claiming the benefit of priority from Japanese Patent Application No. 2018-056620, filed Mar. 26, 2018, the entire contents of all of which are incorporated herein by reference.

FIELD

Embodiments described herein relate generally to a display device.

BACKGROUND

Recently, various display devices with built-in touch sensors have been proposed. For example, a display device in which a plurality of electrodes formed in a display panel function as sensor electrodes in a touch sensing mode and function as common electrodes in a display mode is disclosed. As the touch sensing method, either one of a mutual capacitance method and a self-capacitance method is applied. In the touch sensing mode, a touch drive voltage is applied to the sensor electrodes through signal lines, and sensing is performed.

BRIEF DESCRIPTION OF THE DRAWINGS

FIG. 1 is a plan view showing the external appearance of a display device DSP of the present embodiment.

FIG. 3 is an enlarged plan view of a second area A2 including a pad portion PD shown in FIG. 1.

FIG. 6 is a cross-sectional view of the first substrate SUB1 including a wiring line WR taken along line E-F shown in FIG. 3.

FIG. 7 is a cross-sectional view of the first substrate SUB1 including a connection portion CP and a terminal TA taken along line G-H shown in FIG. 3.

FIG. 8 is a plan view showing a configuration example of a touch sensor TS.

DETAILED DESCRIPTION

Figure 2:
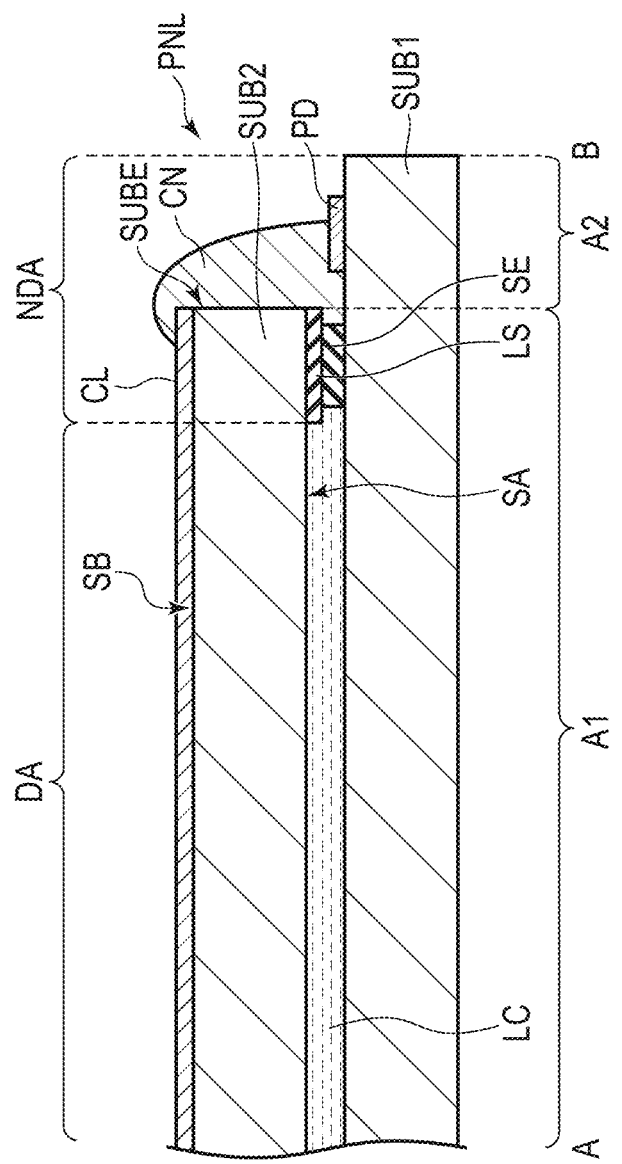
FIG. 2 is a cross-sectional view of a display panel PNL taken along line A-B shown in FIG. 1.

In general, according to one embodiment, there is provided a display device including a first substrate which includes a first area and a second area, a second substrate which includes a substrate end portion located at a boundary between the first area and the second area and overlaps the first area, and a connection member. The first substrate includes a pad portion in the second area. The second substrate includes a transparent conductive film located on an outer surface on a side opposite to an inner surface opposed to the first substrate. The connection member electrically connects the pad portion and the transparent conductive film. The pad portion includes a second metal layer, a first organic insulating film having a first through hole penetrating to the second metal layer, a third metal layer being in contact with the second metal layer in the first through hole, and a second organic insulating film covering an end portion of the third metal layer and having a second through hole penetrating to the third metal layer.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed explanations of them that are considered redundant may be appropriately omitted.

In the present embodiment, a liquid crystal display device is explained as an example of a display device DSP. Note that the main configuration disclosed in the present embodiment can be applied to a self-luminous display device including an organic electroluminescent display element, a μLED or the like, an electronic paper display device including an electrophoretic element or the like, a display device employing micro-electromechanical systems (MEMS), a display device employing electrochromism, and the like.

FIG. 1 is a plan view showing the external appearance of the display device DSP of the present embodiment. A first direction X, a second direction Y and a third direction Z are, for example, orthogonal to one another but may cross at an angle other than 90 degrees. The first direction X and the second direction Y correspond to directions parallel to a main surface of a substrate constituting the display device DSP, and the third direction Z corresponds to a thickness direction of the display device DSP. In the present embodiment, a position on a pointing end side of an arrow indicating the third direction Z is referred to as above, and a position on a side opposite to the pointing end of the arrow is referred to as below. In addition, an observation position at which the display device DSP is observed is assumed to be located on the pointing end side of the arrow indicating the third direction Z, and viewing from this observation position toward an X-Y plane defined by the first direction X and the second direction Y is referred to as planar view. Furthermore, in FIG. 1, a direction crossing at an acute angle counterclockwise with respect to the second direction Y is referred to as a direction D1, and a direction crossing at an acute angle clockwise with respect to the second direction Y is referred to as a direction D2. Note that an angle θ1 formed by the second direction Y and the direction D1 is substantially the same as an angle θ2 formed by the second direction Y and the direction D2.

A plan view of the display device DSP in the X-Y plane is shown here. The display device DSP includes a display panel PNL, a flexible printed circuit board 1, an IC chip 2 and a circuit board 3.

The display panel PNL is a liquid crystal display panel, and includes a first substrate SUB1, a second substrate SUB2, and a liquid crystal layer LC which will be described later. The display panel PNL includes a display portion DA which displays an image, and a frame-shaped non-display portion NDA which surrounds the display portion DA. The first substrate SUBE includes a first area A1 and a second area A2 which are arranged in the second direction Y. The second substrate SUB2 includes a substrate end portion SUB1 located at the boundary between the first area A1 and the second area A2, and overlaps the first substrate SUB1 in the first area A1, but does not overlap the second area A2. The display portion DA is included in the first area A1.

The display portion DA includes a plurality of pixels PX arranged in a matrix (rows and columns) in the first direction (row direction) X and the second direction (column direction) Y. In the illustrated example, pixels PX located in odd-numbered rows along the second direction Y extend along the direction D1. In addition, pixels PX located in even-numbered rows along the second direction Y extend along the direction D2. Note that the pixel PX here indicates the smallest unit which can be individually controlled according to a pixel signal and may be referred to as a sub-pixel. The pixel PX is, for example, any one of a red pixel which displays red, a green pixel which displays green, a blue pixel which displays blue, and a white pixel which displays white.

The flexible printed circuit board 1 is mounted in the second area A2. The IC chip 2 is mounted on the flexible printed circuit board 2. Note that the IC chip 2 may be mounted in the second area A2. The IC chip 2 includes a built-in display driver DD which outputs a signal required for displaying an image in an image display mode of displaying an image. In the illustrated example, the IC chip 2 includes a built-in touch controller TC which controls a touch sensing mode of detecting approach or contact of an object to or with the display device DSP.

The first substrate SUB1 includes a terminal T, a pad portion PD and a wiring line WR in the second area A2. The terminal T is electrically connected to the flexible printed circuit board 1. The terminal T includes a terminal TA having a ground potential. The wiring line WR electrically connects the terminal TA and the pad portion PD. In the illustrated example, the pad portion PD is disposed at each of two positions which are located across the flexible printed circuit board 1 from each other.

Instead of being disposed at two positions located across the flexible printed circuit board 1, the pad portion PD may be disposed at, for example, one position on one side of the flexible printed circuit board 1. Alternatively, another second area (hereinafter referred to as a third area) in which the flexible printed circuit board 1 is not located, that is, an area in which the first substrate SUB1 and the second substrate SUB2 do not overlap may be separately formed as a third area, and the pad portion PD may be disposed in the third area.

The second substrate SUB2 includes a transparent conductive film CL. The transparent conductive film CL is formed substantially over an entire area overlapping the first area A1, and also overlaps each pixel PX of the display portion DA. The transparent conductive film CL is formed of a transparent conductive material such as indium tin oxide (ITO) or indium zinc oxide (IZO).

A connection member CN is located in the non-display portion NDA, and electrically connects the pad portion PD and the transparent conductive film CL. The connection member CN is, for example, a conductive paste or a conductive tape.

The display panel PNL of the present embodiment may be of any one of a transmissive type having a transmissive display function of displaying an image by selectively transmitting light from a rear surface side of the first substrate SUB1, a reflective type having a reflective display function of displaying an image by selectively reflecting light from a front surface side of the second substrate SUB2, and a transflective type having the transmissive display function and the reflective display function.

In addition, although the explanation of the detailed configuration of the display panel PNL is omitted here, the display panel PNL may have a configuration corresponding to any one of a display mode using a lateral electric field along a substrate main surface, a display mode using a longitudinal electric field along a normal to a substrate main surface, a display mode using an inclined electric field along a direction inclined with respect to a substrate main surface, and an appropriate combination of the lateral electric field, the longitudinal electric field and the inclined electric field. The substrate main surface here is a surface parallel to the X-Y plane defined by the first direction X and the second direction Y.

FIG. 2 is a cross-sectional view of the display panel PNL taken along line A-B shown in FIG. 1. Note that only a configuration required for explanation is illustrated here.

The second substrate SUB2 has an inner surface SA opposed to the first substrate SUB1, and an outer surface SB on a side opposite to the inner surface SA. A light-shielding layer LS is disposed on the inner surface SA of the second substrate SUB2 and is located in the non-display portion NDA. A sealant SE is located in the non-display portion NDA, bonds the first substrate SUB1 and the second substrate SUB2 together, and seals in the liquid crystal layer LC. The sealant SE is disposed at a position overlapping the light-shielding layer LS. The transparent conductive film CL is disposed on the outer surface SB and is disposed over the display portion DA and the non-display portion NDA. Note that the transparent conductive film CL may be disposed on an outer surface of an insulating substrate included in the second substrate SUB2 or on an outer surface of an optical element bonded to the insulating substrate.

The connection member CN is in contact with the transparent conductive film CL at a position overlapping the sealant SE and the light-shielding layer LS. In addition, the connection member CN is disposed in the second area A2 of the first substrate SUB1 and is in contact with the pad portion PD.

FIG. 3 is an enlarged plan view of the second area A2 including the pad portion PD shown in FIG. 1. The pad portion PD includes metal layers 31 to 33 and transparent conductive layers 41 and 42. The transparent conductive layers 41 and 42 are larger than the metal layers 31 to 33, and overlap the entire metal layers 31 to 33. The metal layers 31 to 33 are arranged on one side of the transparent conductive layers 41 and 42 which is close to a test pad TPD. In the illustrated example, the metal layers 31 to 33 are arranged on the right side of the transparent conductive layers 41 and 42. An area in the central part and on the left side of the transparent conductive layers 41 and 42 does not overlap other conductive layers.

As will be described later, the metal layers 31 to 33 are electrically connected to one another, the metal layer 33 and the transparent conductive layer 41 are electrically connected to each other in a through hole CH12, and the transparent conductive layers 41 and 42 are electrically connected to each other in a through hole CH13. The through hole CH12 is formed at each of a plurality of positions overlapping the metal layer 33. The through holes CH12 are arranged in the first direction X and the second direction Y. The through hole CH13 is less in number than the through hole CH12, and is, for example, a single through hole. The single through hole CH13 overlaps the through holes CH12. The connection member CN is in contact with the pad portion PD, overlaps the through holes CH12, and overlaps the through hole CH13.

In the second area A2, the pad portion PD overlaps an insulating film 15 having the through holes CH12, but the wiring line WR and the terminal TA do not overlap the insulating film 15. In addition, the test pad TPD for testing breakage of the display panel PNL or the like, a plate PT on which the unique number of the display panel PNL or the like is written, and the like do not overlap the insulating film 15. The wiring line WR connects the pad portion PD and the terminal TA without overlapping the test pad TPD and the plate PT. The wiring line WR includes at least one bent portion BE) and a plurality of branched connection portions CP. In the illustrated example, the wiring line WR includes a plurality of bent portions BD and two connection portions CP. The connection portions CP overlap the terminals TA and are electrically connected to the terminals TA, respectively.

According to this configuration, the electric charge of the second substrate SUB2 flows to the pad portion PD of the first substrate SUB1 via the connection member CN, and flows to the outside from the terminals TA via the wiring line WR (electric discharge).

Figure 4:
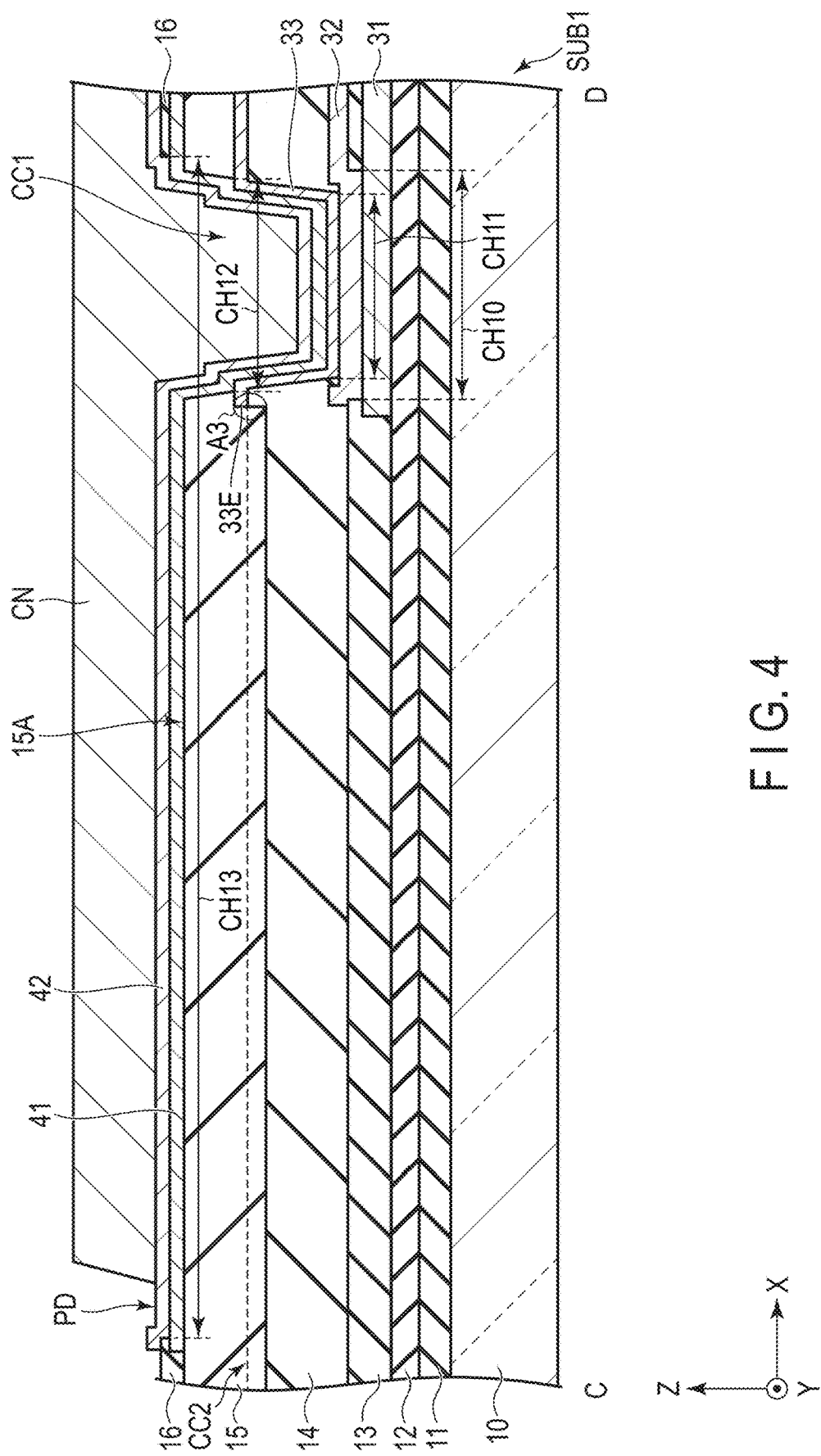
FIG. 4 is a cross-sectional view of a first substrate SUB1 including the pad portion PD taken along line C-D shown in FIG. 3.

FIG. 4 is a cross-sectional view of the first substrate SUB1 including the pad portion PD taken along line C-D shown in FIG. 3. Note that, although more than one through hole CH12 is arranged on line C-D shown in FIG. 3, only one through hole CH12 is illustrated here. The first substrate SUB1 includes an insulating substrate 10, insulating films 11 to 16, and the pad portion PD.

The insulating substrate 10 is a transparent substrate such as a glass substrate or a flexible resin substrate. The insulating film 11 is located on the insulating substrate 10, the insulating film 12 is located on the insulating film 11, the insulating film 13 is located on the insulating film 12, the insulating film 14 is located on the insulating film 13, the insulating film 15 is located on the insulating film 14, and the insulating film 16 is located on the insulating film 15.

Each of the insulating films 11 to 13 and the insulating film 16 is an inorganic insulating film formed of an inorganic material such as silicon oxide, silicon nitride or silicon oxynitride, and may have a single-layer structure or a multilayer structure. Each of the insulating films 14 and 15 is, for example, an organic insulating film formed of an organic material such as acrylic resin.

The metal layer 31 is located between the insulating films 12 and 13. The insulating film 13 has a through hole CH10 penetrating to the metal layer 31. The metal layer 32 is located between the insulating films 13 and 14 and is in contact with the metal layer 31 in the through hole CH10. The insulating film 14 has a through hole CH11 penetrating to the metal layer 32. The metal layer 33 is located between the insulating films 14 and 15 and is in contact with the metal layer 32 in the through hole CH11. An end portion 33E of the metal layer 33 is covered with the insulating film 15. The insulating film 15 has the through hole CH12 penetrating to the metal layer 33. The transparent conductive layer 41 is located between the insulating films 15 and 16 and is in contact with the metal layer 33 in the through hole CH12. The through hole CH12 is located directly above the through holes CH10 and CH11. The insulating film 16 has the through hole CH13 penetrating to the transparent conductive layer 41. The transparent conductive layer 42 is located on the insulating film 16 and is in contact with the transparent conductive layer 41 in the through hole CH13. The connection member CN is in contact with the transparent conductive layer 42. In addition, the connection member CN is also arranged in a concave portion CC1 formed by the through holes CH11 and CH12. In a case where the connection member CN is a conductive paste, the connection member CN may fill the concave portion CC1. Accordingly, as compared with a case where the concave portion CC1 is not provided, the contact area of the connection member CN and the transparent conductive layer 42 can be increased.

Each of the metal layers 31 to 33 is formed of a metal material such as aluminum (Al), titanium (Ti), silver (Ag), molybdenum (Mo), tungsten (W), copper (Cu) or chromium (Cr), an alloy obtained by combining these metal materials, or the like, and may have a single-layer structure or a multilayer structure.

For example, the metal layer 31 is formed of a molybdenum tungsten alloy. Each of the metal layers 32 and 33 is composed of a first layered body or a second layered body. The first layered body corresponds to a stack of layers in which a layer containing titanium (Ti), a layer containing aluminum (Al), and a layer containing titanium (Ti) are stacked in this order. The second layered body corresponds to a stack of layers in which a layer containing molybdenum (Mo), a layer containing aluminum (Al), and a layer containing molybdenum (Mo) are stacked in this order.

Each of the transparent conductive layers 41 and 42 is formed of a transparent conductive material such as ITO or IZO.

The insulating film 14 may have a concave portion CC2 in an area located more outward than the end portion 33E of the metal layer 33 (a portion with which the metal layer 33 is not in contact). The concave portion CC2 may be formed by, for example, removal of a surface of the metal layer 33 by drying etching at the time of patterning of the metal layer 33. The insulating film 15 is arranged in the concave portion CC2 and covers a step portion A3 formed by the end portion 33E and the concave portion CC2. Accordingly, an upper surface 15A of the insulating film 15 with which the transparent conductive layer 41 is in contact is planarized without being influenced by the step portion A3.

In the above-described configuration example, for example, the metal layer 31 corresponds to a first metal layer, the metal layer 32 corresponds to a second metal layer, the metal layer 33 corresponds to a third metal layer, the transparent conductive layer 41 corresponds to a first transparent conductive layer, the transparent conductive layer 42 corresponds to a second transparent conductive layer, the insulating film 14 corresponds to a first organic insulating film, the through hole CH11 corresponds to a first through hole, the insulating film 15 corresponds to a second organic insulating film, the through hole CH12 corresponds to a second through hole, the insulating film 16 corresponds to an inorganic insulating film, and the through hole CH13 corresponds to a third through hole.

Figure 5:
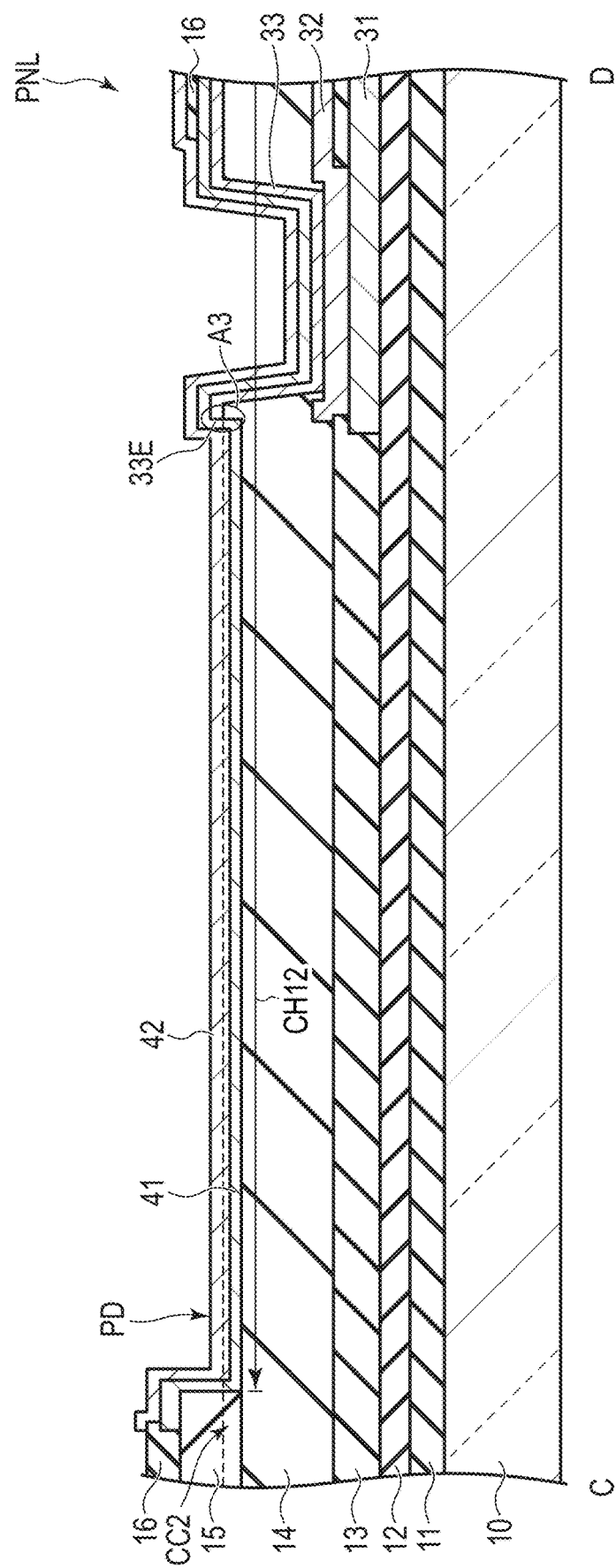
FIG. 5 is a cross-sectional view of a first substrate SUB1 in a comparative example.

FIG. 5 is a cross-sectional view of a first substrate SUB1 in a comparative example. The first substrate SUB1 shown in FIG. 5 is different from the first substrate SUB1 shown in FIG. 4 in that the insulating film 15 has a through hole CH12 larger than the size of the metal layer 33. Note that the illustration of the connection member CN is omitted in FIG. 5.

In the comparative example, the insulating film 15 is not arranged in the step portion A3 including the end portion 33E of the metal layer 33. The transparent conductive layer 41 is in contact with the metal layer 33 and the end portion 33E, and is also in contact with the step portion A3. In this case, a part of the transparent conductive layer 41 which is in contact with the step portion A3 may be locally thinned, and depending on circumstances, the transparent conductive layer 41 may be broken apart. In addition, electric charge from the second substrate SUB2 may be less likely to flow, and display quality may be degraded by electric charge buildup of the second substrate SUB2.

According to the present embodiment, since the end portion 33E of the metal layer 33 is covered with the insulating film 15, even if the concave portion CC2 is formed in the insulating film 14, the transparent conductive layer 41 is not in contact with the step portion A3 including the end portion 33E. Therefore, breakage of the transparent conductive layer 41 caused by the step portion A3 can be suppressed. Consequently, reliability degradation can be suppressed.

In addition, breakage of the transparent conductive layer 41 caused by overcurrent from the second substrate SUB2 can be suppressed. Therefore, electric charge buildup of the second substrate SUB2 can be suppressed, and display quality degradation caused by electric charge buildup can be suppressed.

FIG. 6 is a cross-sectional view of the first substrate SUB1 including the wiring line WR taken along line E-F shown in FIG. 3. The wiring line WR includes conductive layers 51 and 52. The conductive layer 51 is located between the insulating films 12 and 13. The conductive layer 51 is integrally formed with the metal layer 31 and is formed of the same material as the metal layer 31. The insulating film 13 has a groove GR penetrating to the conductive layer 51. The conductive layer 52 is located between the insulating films 13 and 14 and is in contact with the conductive layer 51 in the groove GR. The conductive layer 52 is integrally formed with the metal layer 32 and is formed of the same material as the metal layer 32.

As shown in FIG. 3, the groove GR extends substantially over the entire wiring line WR (the entire wiring line WR from a position connected to the pad portion PD to the connection portions CP through the bend portions BD). That is, the wiring line WR has the illustrated cross-sectional structure substantially over the entire wiring line WR, and has the same cross-sectional structure in the bend portions BD and the connection portions CP. Therefore, as compared with a case where the wiring line WR is formed of a single conductive layer, the cross-sectional area can be increased. Consequently, the wiring line WR is made less resistive, and breakage of the wiring line WR caused by overcurrent from the second substrate SUB2 can be suppressed in the bend portions BD or the like. Note that the groove GR may not continuously extend over the entire wiring line WR but may be scattered at a plurality of positions such as the bend portions BD.

As described above, the insulating film 15 is not arranged in an area in which the wiring line WR is disposed. Therefore, directly above the conductive layer 52, the insulating film 14 is in contact with the conductive layer 52, and the insulating film 16 is in contact with the insulating film 14.

In the configuration example shown in FIG. 6, for example, the conductive layer 51 corresponds to a first conductive layer, the conductive layer 52 corresponds to a second conductive layer, the insulating film 13 corresponds to an interlayer insulating film, the insulating film 14 corresponds to the first organic insulating film, and the insulating film 16 corresponds to the inorganic insulating film.

FIG. 7 is a cross-sectional view of the first substrate SUB1 including the connection portion CP and the terminal TA taken along line G-H shown in FIG. 3. Similarly to the cross-sectional structure shown in FIG. 6, the connection portion CP includes the conductive layers 51 and 52. The terminal TA includes conductive layers 53 to 55. The insulating film 14 has a through hole CH14 penetrating to the conductive layer 52 of the connection portion CP. The conductive layer 53 is in contact with the conductive layer 52 in the through hole CH14. The conductive layer 53 is formed of the same material as the above-described metal layer 33. The conductive layer 54 is in contact with the conductive layer 53 and is also in contact with an upper surface 14A of the insulating film 14. The conductive layer 54 is formed of the same material as the above-described transparent conductive layer 41. The insulating film 16 is in contact with the upper surface 14A and has a through hole CH15 penetrating to the conductive layer 54. The conductive layer 55 is in contact with the conductive layer 54 in the through hole CH15. The conductive layer 55 is formed of the same material as the above-described transparent conductive layer 42.

In the configuration example shown in FIG. 7, for example, the conductive layer 53 corresponds to a third conductive layer, the conductive layer 54 corresponds to a fourth conductive layer, the conductive layer 55 corresponds to a fifth conductive layer, the insulating film 14 corresponds to the first organic insulating film, the through hole CH14 corresponds to a fourth through hole, the insulating film 16 corresponds to the inorganic insulating film, and the through hole CH15 corresponds to a fifth through hole.

Next, a touch sensor TS installed in the display device DSP will be explained.

FIG. 8 is a plan view showing a configuration example of the touch sensor TS. Although the touch sensor TS of a self-capacitance method is explained here, the touch sensor TS may be of a mutual capacitance method. The touch sensor TS includes a plurality of sensor electrodes Rx (Rx1, Rx2, etc.) and a plurality of sensor lines L (L1, L2, etc.) The sensor electrodes Rx are located in the display portion DA and are arranged in a matrix in the first direction X and the second direction Y. One sensor electrode Rx constitutes a sensor block B which is the smallest unit which can perform touch sensing. In the display portion DA, the sensor lines L extend along the second direction Y and are arranged in the first direction X. The sensor lines L are disposed at, for example, positions overlapping signal lines S which will be described later, respectively. In addition, the sensor lines L are drawn to the non-display portion NDA and are electrically connected to the IC chip 2, respectively.

Here, attention is focused on the relationship between the sensor lines L1 to L3 arranged in the first direction X and the sensor electrodes Rx1 to Rx3 arranged in the second direction Y. The sensor line L1 overlaps the sensor electrodes Rx1 to Rx3 and is electrically connected to the sensor electrode Rx1. The sensor line L2 overlaps the sensor electrodes Rx2 and Rx3 and is electrically connected to the sensor electrode Rx2. A dummy line D20 is apart from the sensor line L2. The dummy line D20 overlaps the sensor electrode Rx1 and is electrically connected to the sensor electrode Rx1. The sensor line L2 and the dummy line D20 are located on the same signal line. The sensor line L3 overlaps the sensor electrode Rx3 and is electrically connected to the sensor electrode Rx3. A dummy line D31 overlaps the sensor electrode Rx1 and is electrically connected to the sensor electrode Rx1. A dummy line D32 is apart from the dummy line D31 and the sensor line L3. The dummy line D32 overlaps the sensor electrode Rx2 and is electrically connected to the sensor electrode Rx2. The sensor line L3 and the dummy lines D31 and D32 are located on the same signal line.

In the touch sensing mode, the touch controller TC applies the touch drive voltage to the sensor lines L. Accordingly, the touch drive voltage is applied to the sensor electrodes Rx, and sensing in the sensor electrodes Rx is performed. Sensor signals corresponding to the sensing results in the sensor electrodes Rx are output to the touch controller TC via the sensor lines L. The touch controller TC or an external host detects the presence or absence of approach or contact of an object to or with the display device DSP and the position coordinates of an object based on the sensor signals.

Note that the sensor electrodes Rx function as common electrodes CE to which a common voltage (Vcom) is applied in the image display mode. The common voltage is a voltage different from the touch drive voltage and is applied from, for example, a voltage supply unit included in the display driver DD via the sensor lines L.

Next, the display portion DA will be explained.

Figure 9:
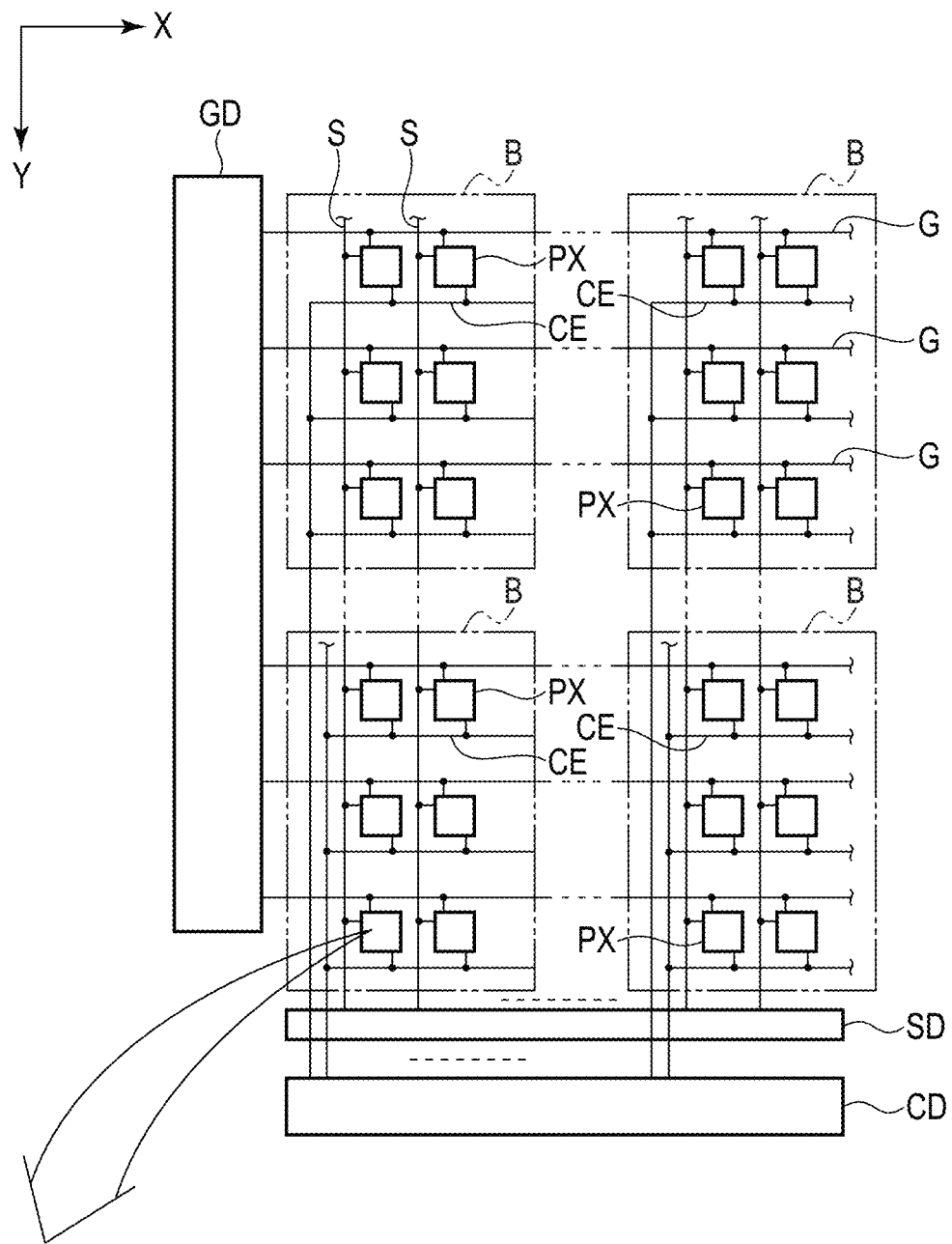
FIG. 9 is an illustration showing the basic configuration and equivalent circuit of pixels PX.
Figure 9:
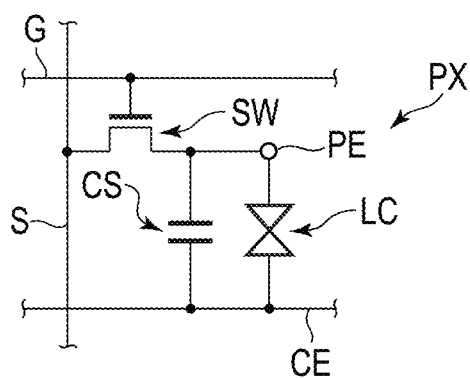

FIG. 9 is an illustration showing the basic configuration and equivalent circuit of the pixels PX. A plurality of scanning lines G are connected to a scanning line drive circuit GD. A plurality of signal lines S are connected to a signal line drive circuit SD. Note that the scanning lines G and the signal lines S do not necessarily extend straight and may be partly bent. For example, even if the signal lines S are partly bent, they are assumed to extend in the second direction Y.

The common electrode CE is disposed for each sensor block B. The common electrode CE is disposed over a plurality of pixels PX. The common electrode CE is connected to a voltage supply unit CD and the touch controller TC shown in FIG. 1. In the image display mode, the voltage supply unit CD supplies the common voltage (Vcom) to the common electrodes CE. In the touch sensing mode, the touch controller TC supplies the touch drive voltage different from the common voltage to the common electrodes CE.

Each pixel PX includes a switching element SW, a pixel electrode PE, the common electrode CE, the liquid crystal layer LC and the like. The switching element SW is composed of, for example, a thin film transistor (TFT) and is electrically connected to the scanning line G and the signal line S. The scanning line G is electrically connected to the switching element SW in each of the pixels PX arranged in the first direction X. The signal line S is electrically connected to the switching element SW in each of the pixels PX arranged in the second direction Y. The pixel electrode PE is electrically connected to the switching element SW. Each pixel electrode PE is opposed to the common electrode CE and drives the liquid crystal layer LC by an electric field generated between the pixel electrode PE and the common electrode CE. A capacitance CS is formed between, for example, an electrode having the same potential as the common electrode CE and an electrode having the same potential as the pixel electrode PE.

Figure 10:
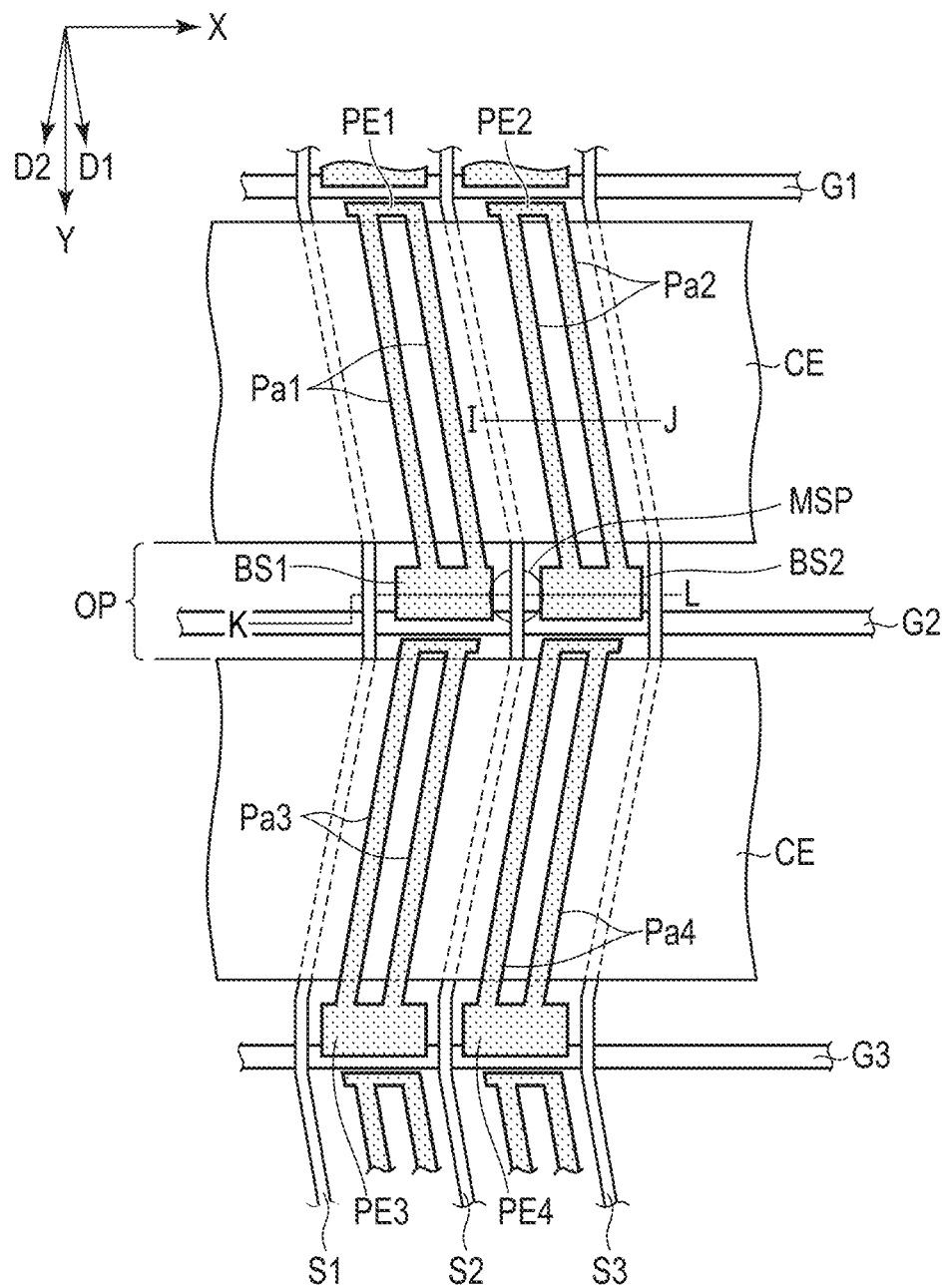
FIG. 10 is a plan view showing an example of a pixel layout.

FIG. 10 is a plan view showing an example of a pixel layout. Only a configuration required for explanation is illustrated here. Scanning lines G1 to G3 extend straight along the first direction X and are arranged at intervals in the second direction Y. Signal lines S1 to S3 extend substantially along the second direction Y and are arranged at intervals in the first direction X.

Pixel electrodes PE1 and PE2 are located between the scanning lines G1 and G2 and are arranged along the first direction X. The pixel electrodes PE1 and PE2 have base portions BS1 and BS2 and strip electrodes Pa1 and Pa2, respectively. The base portions BS1 and BS2 are located in an opening OP of the common electrode CE. The base portions BS1 and BS2 are arranged in the first direction X. The strip electrodes Pa1 and Pa2 overlap the common electrode CE. The strip electrodes Pa1 and Pa2 extend along the direction D1.

Although not described in detail, pixel electrodes PE3 and PE4 are located between the scanning lines G2 and G3. The pixel electrodes PE3 and PE4 have strip electrodes Pa3 and Pa4 overlapping the common electrode CE, respectively. The strip electrodes Pa3 and Pa4 extend along the direction D2. The number of strip electrodes Pa1 to Pa4 is two in the illustrated example but may be one or greater than or equal to three.

A main spacer MSP is located between the base portions BS1 and BS2. The main spacer MSP forms a cell gap between the first substrate SUB1 and the second substrate SUB2. Note that the main spacer MSP may be replaced with a sub-spacer SSP. The sub-spacer SSP is not in contact with the first substrate SUB1 in a steady state in which no stress is applied from the outside to the display panel PNL, and has, for example, a height less than the height of the main spacer MSP.

Figure 11:
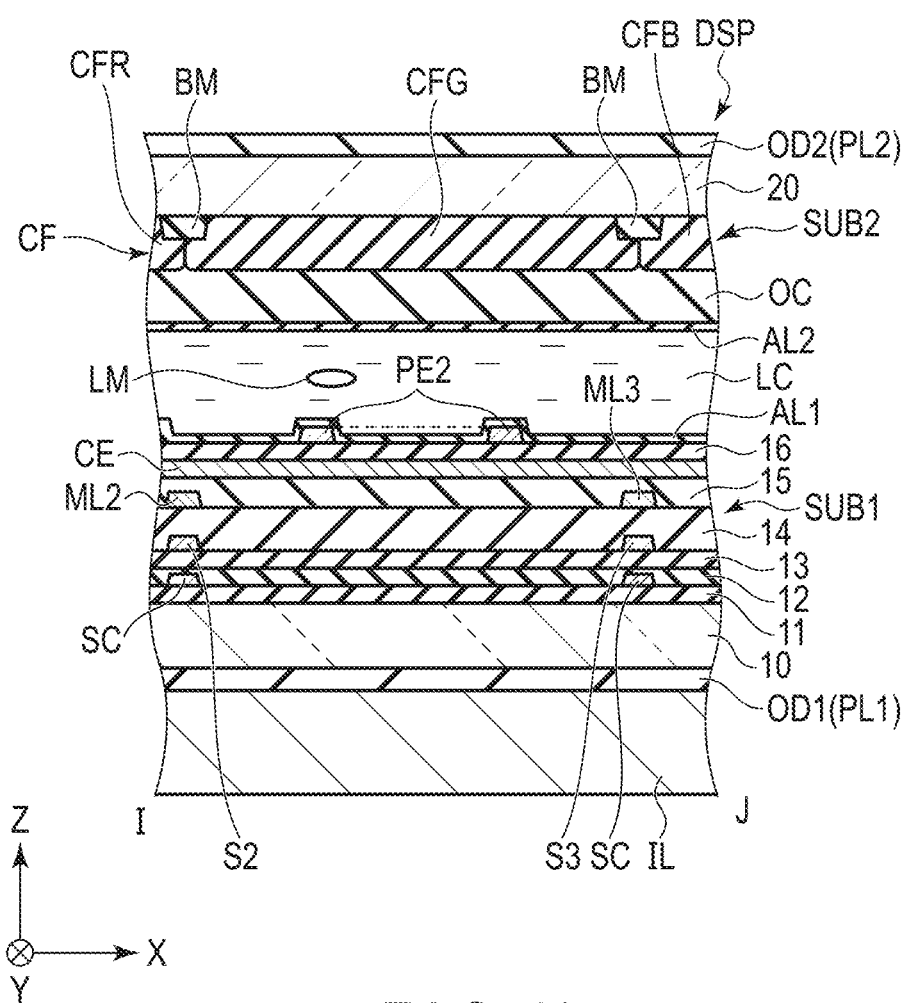
FIG. 11 is a cross-sectional view of the display device DSP taken along line I-J shown in FIG. 10.

FIG. 11 is a cross-sectional view of the display device DSP taken along line I-J shown in FIG. 10. The illustrated example corresponds to an example where a fringe field switching (FFS) mode which is one display mode using a lateral electric field is applied.

The first substrate SUB1 includes a semiconductor SC, the signal lines S2 and S3, metal lines ML2 and ML3, the common electrode CE, the pixel electrode PE2, an alignment film AL1 and the like. The semiconductor SC is located on the insulating film 11 and is covered with the insulating film 12. The semiconductor SC is formed of, for example, polycrystalline silicon but may be formed of amorphous silicon or oxide semiconductor. Scanning lines which are not illustrated are located between the insulating films 12 and 13.

The signal lines S2 and S3 are located on the insulating film 13 and are covered with the insulating film 14. Note that other signal lines which are not illustrated are also located in the same layer as the signal line S2. The metal lines ML2 and ML3 are located on the insulating film 14 and are covered with the insulating film 15. The metal line ML2 is located directly above the signal line S2, and the metal line ML3 is located directly above the signal line S3. Other metal lines which are not illustrated are also located in the same layer as the metal line ML2. The metal lines ML2 and ML3 extend parallel to the signal lines S2 and S3, respectively. These metal lines ML2 and ML3 can form the sensor lines (L1, L2, L3, etc.) of the touch sensor TS explained with reference to FIG. 8 or the dummy lines D.

The common electrode CE is located on the insulating film 15 and is covered with the insulating film 16. The common electrode CE is electrically connected to the metal lines ML2 and ML3 via contact holes formed in the insulating film 15.

The pixel electrode PE2 is located on the insulating film 16 and is covered with the alignment film AL1. Other pixel electrodes which are not illustrated are also located in the same layer as the pixel electrode PE2.

The second substrate SUB2 includes an insulating substrate 20, a light-shielding layer BM, a color filter layer CF, an overcoat layer OC, an alignment film AL2 and the like. This second substrate SUB2 may be referred to as a color filter substrate. Similarly to the insulating substrate 10, the insulating substrate 20 is a transparent substrate such as a glass substrate or a flexible resin substrate. The color filter layer CF includes a red color filter CFR, a green color filter CFG and a blue color filter CFB. The color filter CFG is opposed to the pixel electrode PE2. The other color filters CFG and CFB are opposed to other pixel electrodes PE, respectively. The overcoat layer OC covers the color filter layer CF. The overcoat layer OC is an organic insulating film formed of a transparent organic material. The alignment film AL2 covers the overcoat layer OC. Each of the alignment films AL1 and AL2 is formed of, for example, a material exhibiting horizontal alignment properties.

The above-described main spacer MSP and sub-spacer SSP are, although not illustrated, located between the first substrate SUBM and the second substrate SUB2. The main spacer MSP forms a predetermined cell gap between the first substrate SUB1 and the second substrate SUB2. The cell gap is, for example, 2 μm to 5 μm. The first substrate SUB1 and the second substrate SUB2 are bonded together by the sealant SE shown in FIG. 2 with the predetermined cell gap formed in between.

The liquid crystal layer LC is located between the first substrate SUB1 and the second substrate SUB2 and is held between the alignment film AL1 and the alignment film AL2. The liquid crystal layer LC contains liquid crystal molecules LM. This liquid crystal layer LC is formed of a positive liquid crystal material (having positive dielectric anisotropy) or a negative liquid crystal material (having negative dielectric anisotropy).

An optical element OD1 including a polarizer PL1 is bonded to the insulating substrate 10. An optical element OD2 including a polarizer PL2 is bonded to the insulating substrate 20. Note that each of the optical elements OD1 and OD2 may include a retarder, a scattering layer, an antireflective layer or the like as needed. An illumination device IL illuminates the first substrate SUB1 of the display panel PNL with white illumination light.

In this display panel PNL, in an off state where no electric field is formed between the pixel electrode PE2 and the common electrode CE, the liquid crystal molecules LM are initially aligned in a predetermined direction between the alignment films AL1 and AL2. In this off state, illumination light emitted from the illumination device IL toward the display panel PNL is absorbed by the optical elements OD1 and OD2, and dark display is realized. On the other hand, in an on state where an electric field is formed between the pixel electrode PE2 and the common electrode CE, the liquid crystal molecules LM are aligned in a direction different from the initial alignment direction by the electric field, and the alignment direction is controlled by the electric field. In this on state, a part of the illumination light from the illumination device IL is transmitted through the optical elements OD1 and OD2, and light display is realized.

Figure 12:
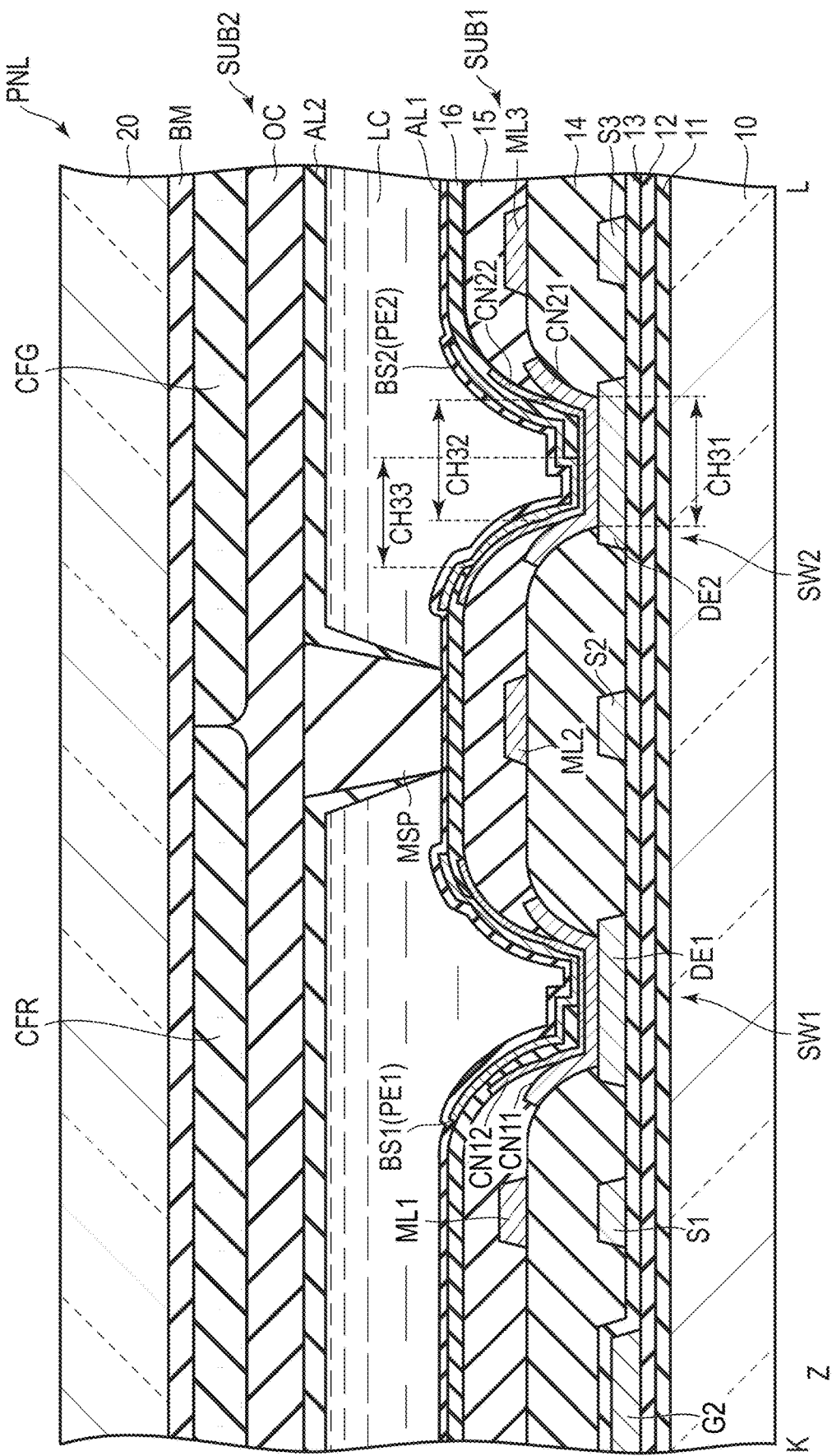
FIG. 12 is a cross-sectional view of the display panel PNL taken along line K-L shown in FIG. 10.

FIG. 12 is a cross-sectional view of the display panel PNL taken along line K-L shown in FIG. 10. Note that the illustration of the semiconductor located between the insulating film 11 and the insulating film 12 is omitted.

The scanning line G2 is located on the insulating film 12 and is covered with the insulating film 13. The scanning line G2, the metal layer 31 shown in FIG. 4, and the conductive layer 51 shown in FIG. 6 are formed in the same process and are formed of the same material.

A drain electrode DE1 of a switching element SW1 and a drain electrode DE2 of a switching element SW2 are located on the insulating film 13 and are covered with the insulating film 14. The drain electrodes DE1 and DE2, the signal lines S1 to S3, the metal layer 32 shown in FIG. 4, and the conductive layer 52 shown in FIG. 6 are formed in the same process and are formed of the same material.

Connection electrodes CN11 and CN21, metal lines ML1 to ML3, the metal layer 33 shown in FIG. 4, and the conductive layer 53 shown in FIG. 7 are formed in the same process and are formed of the same material. The connection electrode CN11 is in contact with the drain electrode DE1, and the connection electrode CN21 is in contact with the drain electrode DE2. More specifically, for example, the insulating film 14 has a through hole CH31 penetrating to the drain electrode DE2. The connection electrode CN21 is in contact with the drain electrode DE2 in the through hole CH31.

Connection electrodes CN12 and CN22, the common electrode CE shown in FIG. 11, the transparent conductive layer 41 shown in FIG. 4, and the conductive layer 54 shown in FIG. 7 are formed in the same process and are formed of the same material. The connection electrode CN12 is in contact with the connection electrode CN11, and the connection electrode CN22 is in contact with the connection electrode CN21. More specifically, for example, the insulating film 15 has a through hole CH32 penetrating to the connection electrode CN21. The connection electrode CN22 is in contact with the connection electrode CN21 in the through hole CH32.

The pixel electrodes PE1 and PE2, the transparent conductive layer 42 shown in FIG. 4, and the conductive layer 55 shown in FIG. 7 are formed in the same process and are formed of the same material. The pixel electrode PE1 is in contact with the connection electrode CN12, and the pixel electrode PE2 is in contact with the connection electrode CN22. More specifically, for example, the insulating film 16 has a through hole CH33 penetrating to the connection electrode CN22. The base portion BS2 of the pixel electrode PE2 is in contact with the connection electrode CN22 in the through hole CH33. Note that the pixel electrode PE2 only needs to be electrically connected to the drain electrode DE2, and one or both of the connection electrodes CN21 and CN22 may be omitted.

When the size of the through hole CH32 formed in the insulating film 15 and the size of the through hole CH12 shown in FIG. 4 are compared, the through hole CH32 has an equal size to the through hole CH12. For example, the through holes CH12 and CH32 have the size of 3 μm to 5 μm.

When the size of the through hole CH33 formed in the insulating film 16 and the size of the through hole CH13 shown in FIG. 4 are compared, the through hole CH33 is smaller than the through hole CH13. For example, the through hole CH13 has the shape of a rectangle one side of which has a length of several hundreds of micrometers.

The main spacer MSP is located directly above the signal line S2 and the metal line ML2 and is in contact with the overcoat layer OC and the alignment film AL1. Between the metal line ML2 and the main spacer MSP, the insulating films 15 and 16 are in contact with each other, and the insulating film 16 and the alignment film AL1 are in contact with each other.

In the configuration example shown in FIG. 12, for example, the connection electrode CN21 corresponds to a first connection electrode, the connection electrode CN22 corresponds to a second connection electrode, the insulating film 14 corresponds to the first organic insulating film, the through hole CH31 corresponds to a sixth through hole, the insulating film 15 corresponds to the second organic insulating film, the through hole CH32 corresponds to a seven through hole, the insulating film 16 corresponds to the inorganic insulating film, and the through hole CH33 corresponds to an eighth through hole.

As explained above, according to the present embodiment, a display device which can suppress reliability degradation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate comprising a first area and a second area;
a second substrate comprising a substrate end portion located at a boundary between the first area and the second area, and overlapping the first area; and
a connection member, wherein
the first substrate comprises an insulating substrate and a pad portion in the second area,
the second substrate comprises a transparent conductive film located on an outer surface on a side opposite to an inner surface opposed to the first substrate,
the connection member electrically connects the pad portion and the transparent conductive film, and
the pad portion comprises an organic insulating film having a first surface on a side opposite to a second surface opposed to the insulating substrate, a first metal portion in contact with the first surface, and a first insulating film covering an end portion of the first metal portion and the first surface of the organic insulating film.

2. The display device of claim 1, wherein
the first insulating film is in contact with the end portion of the first metal portion, and
the first insulating film is in contact with the first surface of the organic insulating film.

3. The display device of claim 1, wherein
the first substrate further comprises a plurality of signal lines arrayed in a first direction, and a plurality of scanning lines arrayed in a second direction,
the first metal portion is formed in a first metal layer,
the plurality of scanning lines is formed in a second metal layer that is a different metal layer from the first metal layer, and
the plurality of signal lines is formed in a third metal layer that is a different metal layer from the first metal layer and the second metal layer.

4. The display device of claim 3, wherein
the pad portion further comprises a transparent conductive portion on the first insulating film,
the transparent conductive portion is connected to the first metal portion via a through hole formed in the first insulating film, and
the connection member is in contact with the transparent conductive portion.

5. The display device of claim 4, wherein the transparent conductive portion has a laminated structure in which a first transparent conductive portion and a second transparent conductive portion are laminated.

6. The display device of claim 3, wherein the first insulating film is formed of an organic material.

7. The display device of claim 3, wherein
the first insulating film has a plurality of through holes, and
the plurality of through holes exposes the first metal portion.

8. A display device comprising:
a first substrate comprising a first area and a second area;
a second substrate comprising a substrate end portion located at a boundary between the first area and the second area, and overlapping the first area; and
a connection member, wherein
the first substrate comprises a pad portion in the second area,
the second substrate comprises a transparent conductive film located on an outer surface on a side opposite to an inner surface opposed to the first substrate,
the connection member electrically connects the pad portion and the transparent conductive film, and
the pad portion comprises a second metal layer, an organic insulating film having a first through hole penetrating to the second metal layer, a third metal layer being in contact with the second metal layer in the first through hole, and a first insulating film covering an end portion of the third metal layer and having a second through hole penetrating to the third metal layer.

9. The display device of claim 8, wherein
the first substrate further comprises a terminal having a ground potential and a wiring line electrically connecting the terminal and the pad portion in the second area,
the pad portion comprises a first metal layer being in contact with the second metal layer, a first transparent conductive layer being in contact with the third metal layer in the second through hole, an inorganic insulating film having a third through hole penetrating to the first transparent conductive layer, and a second transparent conductive layer being in contact with the first transparent conductive layer in the third through hole, and
the second metal layer is located between the first metal layer and the third metal layer in the first through hole.

10. The display device of claim 9, wherein the first transparent conductive layer and the second transparent conductive layer are larger than the third metal layer in planar view.

11. The display device of claim 9, wherein
the first insulating film has a plurality of the second through holes, and
the third through hole overlaps the second through holes in planar view.

12. The display device of claim 9, wherein the connection member overlaps a plurality of the second through holes in planar view.

13. The display device of claim 8, wherein
the organic insulating film comprises a concave portion located more outward than the end portion of the third metal layer, and
the first insulating film is arranged in the concave portion.

14. The display device of claim 9, wherein the wiring line and the terminal do not overlap the first insulating film in planar view.

15. The display device of claim 9, wherein
the wiring line comprises a bent portion and a connection portion, and
the connection portion overlaps the terminal and is electrically connected to the terminal.

16. The display device of claim 15, wherein the wiring line comprises a first conductive layer integrally formed with the first metal layer, an interlayer insulating film having a groove penetrating to the first conductive layer, and a second conductive layer integrally formed with the second metal layer and being in contact with the first conductive layer in the groove.

17. The display device of claim 16, wherein the groove extends over the entire wiring line.

18. The display device of claim 17, wherein directly above the second conductive layer, the organic insulating film is in contact with the second conductive layer, and the inorganic insulating film is in contact with the organic insulating film.

19. The display device of claim 16, wherein the terminal comprises:

the organic insulating film having a fourth through hole penetrating to the second conductive layer of the connection portion;

a third conductive layer formed of a same material as the third metal layer and being in contact with the second conductive layer in the fourth through hole;

a fourth conductive layer formed of a same material as the first transparent conductive layer and being in contact with the third conductive layer;

the inorganic insulating film being in contact with the organic insulating film and having a fifth through hole penetrating to the fourth conductive layer; and a fifth conductive layer formed of a same material as the second transparent conductive layer and being in contact with the fourth conductive layer in the fifth through hole.

* * * * *